United States Patent [19]

Chang

[11] Patent Number: 4,894,623

[45] Date of Patent: Jan. 16, 1990

[54] COMPACT TUNABLE RF GENERATOR USING A CURRENT CARRYING DIFFRACTION GRATING

[75] Inventor: David B. Chang, Tustin, Calif.

[73] Assignee: Hughes Aircraft Company, Los Angeles, Calif.

[21] Appl. No.: 223,990

[22] Filed: Jul. 25, 1988

[51] Int. Cl.[4] .............................................. H03B 28/00

[52] U.S. Cl. ................................ 331/96; 331/107 DP

[58] Field of Search .............. 331/96, 107 R, 107 DP, 331/82

[56] References Cited

U.S. PATENT DOCUMENTS 3,835,407 9/1974 Yariv et al. ................. 331/107 R X

*Primary Examiner*—Siegfried H. Grimm

*Attorney, Agent, or Firm*—Charles D. Brown; Wanda Denson-Low

[57] ABSTRACT

A compact tunable generator of radio frequency (RF) electromagnetic energy is disclosed. A thin conducting film is applied to a diffraction grating formed from a nonconducting substrate. A voltage source is applied to the film so that a current flows in the convoluted plane of the film in a direction perpendicular to the grooves of the grating. The frequency of the RF energy radiated by this system is determined both by the grating spacing and the applied voltage. The power levels are adequate for testing sensitive receiver systems over a wide range of frequencies.

10 Claims, 1 Drawing Sheet

COMPACT TUNABLE RF GENERATOR USING A CURRENT CARRYING DIFFRACTION GRATING

BACKGROUND OF THE INVENTION

The present invention relates to generator devices for generating radio frequency (RF) electromagnetic radiation, and more particularly to a compact yet tunable RF generator.

A small (card-level) source of RF electromagnetic radiation is required for many applications, such as portable test sets for sensitive (−100 dBm) RF systems. The main requirements of the source or generator are compactness and tunability. High power levels are not required. It is desired that these test sets be able to provide low level radiation tunable from 2 GHz through several tens of GHz., e.g., 40 GHz.

Existing commercially available solid state RF sources are compact, but they do not have the requisite tunability. Free electron masers have the tunability, but not the requisite compactness. Other RF sources such as magnetrons have neither the required compactness nor tunability.

It is therefore an object of the present invention to provide a compact RF generator capable of providing low level RF radiation and which is tunable over a large frequency range.

SUMMARY OF THE INVENTION

A compact tunable generator of RF electromagnetic radiation is disclosed. The tunable generator comprises a diffraction grating formed from an electrically nonconductive substrate. The diffraction grating comprises a plurality of aligned grooves of uniform depth, width and spacing formed in the substrate. A thin film of an electrically conductive material is applied on the diffraction grating.

The tunable generator further comprises a means for applying a variable voltage to the conductive film so that a current flows in the film in a direction substantially perpendicular to the grooves of the diffraction grating. The current results in RF electromagnetic radiation from the grating and film, with the frequency of the radiation dependent on the grating spacing and the applied voltage. By varying the applied voltage, the frequency of the generated radiation may be varied over a wide frequency range.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE DISCLOSED EMBODIMENT

Figure 1:
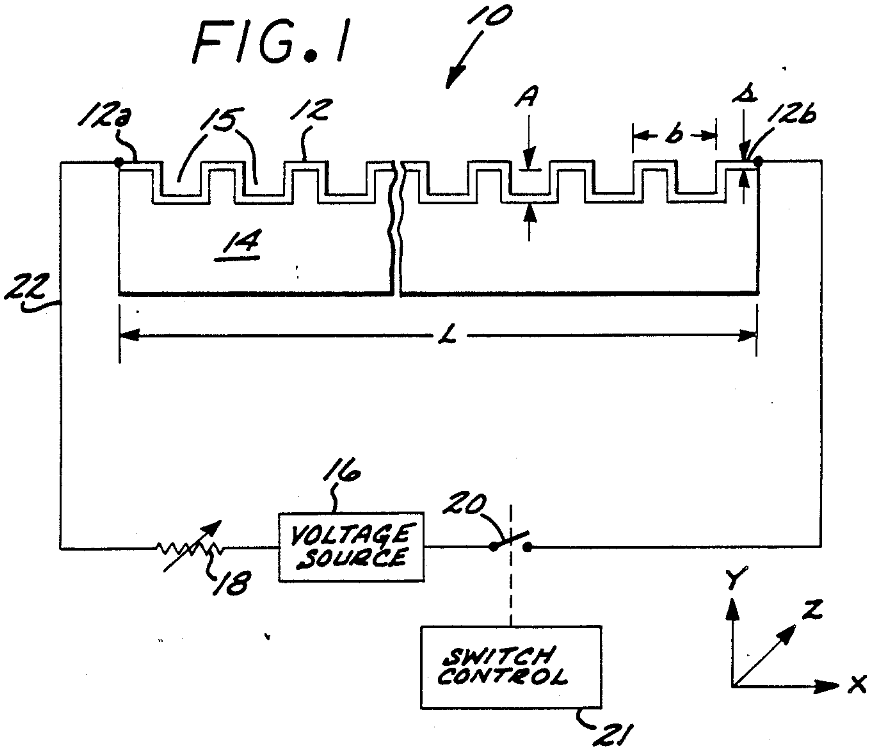
FIG. 1 is a simplified schematic diagram of a tunable RF generator embodying the invention.

A tunable RF generator 10 embodying the invention is depicted in the simplified schematic illustration of FIG. 1. A thin electrically conductive film 12 is deposited on a diffraction grating 14 made of an electrically insulative material such as glass or quartz. The grating comprises a plurality of parallel grooves 15 of a depth A and spacing b defined in the surface of the substrate 14.

Current is made to flow through the film 12 by a voltage source 16. The voltage source 16 is electrically coupled to the sides 12A and 12B of the film 12 through a variable resistance 18 and an on/off switch 20. The voltage source 16 may either comprise a source of DC voltage, e.g., a battery, or a source of AC voltage. As a result, the current flows through the film 12 in a direction substantially perpendicular to the grooves 15 of the grating 14. Since the current follows the convoluted surface defined by the grooves 15 of the grating 14, the charges comprising the current are accelerated. These accelerated charges then radiate. The frequency of the radiation is on the order of $V_D/b$, where $v_D$ is the drift velocity of the charges and b is the grating spacing. Thus, since $v_D$ is proportional to the voltage applied across the film, the frequency of the radiated RF can be changed simply by changing the voltage applied to the grating, which is accomplished here by adjusting the resistance of variable resistor 18. The on-off switch 20 controlled by switch controller 21 completes the circuit.

To illustrate the general power levels of the resulting RF energy radiated by the generator 10, consider a simple model where the grating profile is given by $y=A\cos(k_g x)$, where $k_g=2\mu/b$. When $Ak_g<<1$, the primary acceleration of the charges is in the y direction.

$$y=-(A(k_g v_D)\cos k_g x(t), \quad (1)$$

where for an individual charge located at $x_0$ at $t=0$, $$x(t)=x_0+v_D t. \quad (2)$$

The power radiated by a single charge is the dipole approximation $P_1$ given by equations 3 and 4.

$$P_1 = 2/3\,(e^2/c^3)(y)^2 \quad (3)$$

$$= 2/3\,(e^2/c^3)k_g(v_D)^4 A^2 \quad (4)$$

The total power radiated by the N electrons in the film is $$P=NP_1, \quad (5)$$

and if the film has thickness s, length L (in the X direction), width w (in the Z direction), and electron density $n_0$, $$P=n_0 sLwP_1 \quad (6)$$

The drift velocity $v_D$ of the electrons is given by Ohm's law:

$$v_D=[(e\lambda_{mfp})/(mv_F)]E, \quad (7)$$

where e is the electronic charge, m is the electronic mass, $v_F$ is the Fermi velocity (i.e., $mv_F\sim hn_0^{1/3}$), $\lambda_{mfp}$ is the mean free path for collisions in the metal, and E is the electric field. For an applied voltage V, $$E\sim V/L \quad (8)$$

For many conductors, such as indium tin oxide, $\lambda_{mmfp}$ is of the order of 10−5 cm, and $n_0$ is in the range of $10^{22}-10^{23}$ cm$^{-3}$. Accordingly, $v_D \sim 2\times 10^3), E_{volt/cm}$ cm/sec. (9)

and if V=100 volts and L=1 cm, $v_D$ is about $10^5$ cm/sec.

For a width w=1 cm, a film thickness s=1000Å, and a grating spacing b and amplitude A of 3 microns, the resulting frequency would be ~1 GHz and the power level would be $\sim 5\times 10^{-7}$ watts. This power is quite sufficient to test receivers with sensitivities of −100 dBm (i.e., $10^{-13}$ watts).

The frequency will vary slightly with the angle $\theta$ between the direction of radiation and the plane of the grating $$f \sim \tfrac{1}{2}\pi[(k_g v_D)/(1-(v_D/c)\cos\theta)] \quad (10)$$

However, since $v_D/c$ is on the order of $10^{-5}$, the variation with angle is not significant.

The current I flowing through the film 12 is given by $$I=\mu Ve\, n_0 ws/L. \quad (11)$$

The thermal heating of the film 12 is given by $$P_{Th=n0\, e\mu ws}\, V^2/L. \quad (12)$$

It may be necessary for some applications to utilize semiconductors or semimetals to form the film 12 to reduce the current and heat generation, and to operate in a pulsed mode to avoid overheating. A suitable switch 20 and controller 21 (FIG. 1) may be employed to operate the generator 10 in a pulse mode, i.e., to periodically open and close the switch 20 to achieve a desired pulse rate and duty cycle. Water cooling the substrates may also be employed to cool the substrate if necessary.

The diffraction grating may readily be fabricated using conventional milling or photolithographic etching techniques, depending on the desired grating spacing. For example, a diffraction grating having a grating spacing on the order of a millimeter may be fabricated by milling the grooves in the surface of the substrate. A diffraction grating having a grating spacing on the order of one-half micron may be fabricated by photolithographic etching processes.

The film 12 may comprise such materials as indium tin oxide, gold or other metal, or in some applications a semiconductor such as silicon or a semimetal such as lanthinum hexaboride (LaB6). The film may be applied to the surface by many conventional techniques, such as chemical vapor deposition or sputtering.

Figure 2:
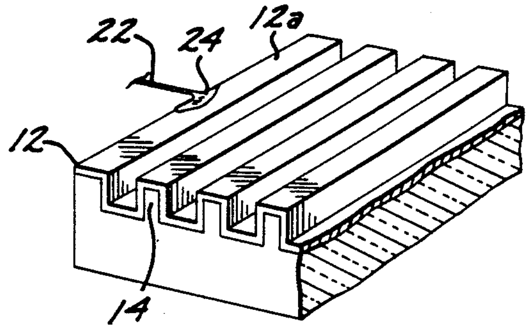
FIG. 2 is a simplified partial perspective view of the diffraction grating and conductive film comprising the tunable RF generator of FIG. 1, showing the connection of one electrical contact to one side of the film and grating.

The voltage may be applied to the film 12 through leads 22 connected to the film surface at the respective sides 12A and 12B by ohmic contacts. FIG. 2 illustrates exemplary lead 22 connected to the side 12A of the film 12 by ohmic contact 24.

It is understood that the above-described embodiment is merely illustrative of the possible specific embodiments which may represent principles of the present invention. Other arrangements may readily be devised in accordance with these principles by those skilled in the art without departing from the scope of the invention.

What is claimed is:

1. A tunable generator of radio frequency (RF) electromagnetic energy, comprising:

a diffraction grating formed from an electrically insulative substrate comprising a plurality of aligned grooves, having a depth A, formed in said substrate;

a thin film of an electrically conductive material formed on said diffraction grating, said film having a thickness significantly less than depth A; and means for applying a variable voltage to said conductive film so that a current flows in the film in a direction substantially perpendicular to the grooves of the whereby RF energy is radiated from said film, the frequency of the radiation being dependent on the grating spacing and the magnitude of applied voltage.

2. The tunable generator of claim 1 wherein the spacing of said grooves is about three microns, and said means for applying a variable voltage is adapted to apply a selectable DC voltage of between 50 to 150 volts, whereby RF energy in the gigahertz range may be generated.

3. The tunable generator of claim 1 wherein said means for applying a variable voltage comprises a DC voltage source and a variable resistor connected in series between the opposing sides of said film which are substantially aligned with the grooves of said diffraction grating.

4. The tunable generator of claim 1 wherein said means for applying a variable voltage comprises an AC voltage source connected between the opposing sides of said film which are substantially aligned with the grooves of said diffraction grating.

5. The tunable generator of claim 1 wherein said thin film comprises a layer of metal deposited on said diffraction grating.

6. The tunable generator of claim 1 wherein said diffraction grating substrate comprises glass or quartz.

7. The tunable generator of claim 1 further comprising means for operating said generator in a pulsed mode.

8. The tunable generator of claim 7 wherein said means for operating said generator in a pulsed mode comprises a switch element connected in series relationship with said means for applying a variable voltage, and a switch controller for periodically opening and closing said switch element to achieve a desired pulse rate and duty cycle.

9. A tunable generator of radio frequency (RF) electromagnetic radiation, comprising:

a diffraction grating formed from an electrically insulative substrate having a plurality of substantially parallel and substantially equally spaced grooves, having a depth A, formed in one surface thereof;

a thin film of electrically conductive material formed on said surface of said diffraction grating to cover said grooves, said film having a thickness significantly less than depth A;

means for applying a variable voltage to said conductive film so that a current flows in the convoluted surface of the film in a direction substantially perpendicular to the grooves of the diffraction grating, said means comprising a DC voltage source and a variable resistance connected in series between opposing sides of the film which are aligned with said grooves, whereby low-level RF electromagnetic energy is radiated from said film, the frequency of the radiation being dependent on the grating spacing and the magnitude of the applied voltage.

10. A tunable generator of radio frequency (RF) electromagnetic radiation, comprising:

a diffraction grating formed from an electrically insulative substrate having a plurality of substantially parallel and substantially equally spaced grooves, having a depth A, formed in one surface thereof;

a thin film of electrically conductive material formed on said surface of said diffraction grating to cover said grooves, said film having a thickness significantly less than depth A;

means for applying a variable voltage to said conductive film so that a current flows in the convoluted surface of the film in a direction substantially perpendicular to the grooves of the diffraction grating, said means comprising an AC voltage source and a variable resistance connected in series between opposing sides of the film which are aligned with said grooves, whereby low-level RF electromagnetic energy is radiated from said film, the frequency of the radiation being dependent on the grating spacing and the magnitude of the applied voltage.

* * * * *